United States Patent [19]

Goldberg et al.

[11] Patent Number: 5,045,159

[45] Date of Patent: Sep. 3, 1991

[54] DERIVATIVES OF COMPOUNDS CONTAINING A CARBONYL GROUP CONJUGATED TO AN AROMATIC MOIETY AND ELECTROPHILIC METHODS OF FABRICATION THEREOF

[75] Inventors: Martin J. Goldberg, Mahopac; Daniel P. Morris, Purchase; Alfred Viehbeck, Stormville, all of N.Y.

[73] Assignee: International Business Machines Corporation, Armonk, N.Y.

[21] Appl. No.: 381,552

[22] Filed: Jul. 18, 1989

[51] Int. Cl.$^5$ ................................................ C25C 3/00
[52] U.S. Cl. .................................. 204/59 R; 525/420; 525/431; 525/436
[58] Field of Search ............. 204/59 R; 525/420, 431, 525/436

[56] References Cited

U.S. PATENT DOCUMENTS

| | | | |
|---|---|---|---|
| 3,288,754 | 11/1966 | Green | 260/47 |
| 4,140,572 | 2/1979 | Stein | 156/653 |
| 4,586,997 | 5/1986 | Lee | 525/426 |
| 4,596,644 | 6/1986 | Banks et al. | 204/59 R |
| 4,672,099 | 6/1987 | Kinimune et al. | 528/26 |
| 4,675,367 | 6/1987 | Policastro et al. | 525/474 |

OTHER PUBLICATIONS

Mazur, S., "Electrochemical Growth of Metal Interlayers in Polyimide Film", J. Phys. Chem, 90, 1365-1372, (1986).

*Primary Examiner*—John F. Niebling
*Assistant Examiner*—Steven P. Marquis
*Attorney, Agent, or Firm*—Daniel P. Morris

[57] ABSTRACT

Derivatives of compounds containing a carbonyl group conjugated to an aromatic moiety and methods of fabrication thereof consisting of a thioether, an ester, an ether, a phosphate and a silylether. Electrons are supplied to the carbonyl group conjugated to an aromatic moiety to form a reduced material. The reduced material is contacted with an electrophile which attacks and chemically combines with the carbonyl group conjugated to an aromatic moiety. The parent material can be regenerated by hydrolysis of the derivative. A silyl derivative can be selectively formed on a polyimide material surface which can act as a barrier to an RIE etch of the polyimide material. After etch the polyimide material is regenerated from the silyl derivative.

51 Claims, No Drawings

DERIVATIVES OF COMPOUNDS CONTAINING A CARBONYL GROUP CONJUGATED TO AN AROMATIC MOIETY AND ELECTROPHILIC METHODS OF FABRICATION THEREOF

CROSS REFERENCE TO RELATED APPLICATIONS

Copending U.S. application Ser. No. 07/290,486 entitled "Method For Conditioning Organic Polymeric Materials" to Viehbeck et al. filed on Dec. 23, 1988 describes certain organic polymeric materials which are capable of reversibly accepting or donating electrons from a reducing entity. The redox sites in the polymer accept electrons and, as a result, a change in the properties of the polymer occurs. This change is useful in modifying or etching the polymeric material. The material can be modified by incorporation of metallic seeds into the material at a controlled depth. The seeds are incorporated by interaction of cations of the metals with the redox sites in the polymer, which cause the reduction of the cations to form the neutral metallic seeds. Subsequent exposure of the polymer material containing the seeds to an electroless bath causes further deposition of metal having the desirable characteristic of good adhesion to the polymeric material. Etching of the polymeric material can be carried out as a result of an increase in solubility of the polymer in aprotic solvents when its redox sites have accepted electrons. The increase solubility allows openings to be etched in certain areas of the polymeric material that have been reduced, leaving other areas unchanged.

Copending U.S. application Ser. No. 381,627 entitled "Process for Nucleophilic Derivatization of Materials Having an Imide Group Conjugated to an Aromatic Moiety" to Goldberg et al. filed on the same day describes a process for the synthesis of derivatives of materials containing an imide group conjugated to an aromatic moiety to form an ester, a thioester, an amide, a ketone, and silylesters. Electrons are supplied to redox sites to form a reduced imide material. The reduced imide material is contacted with a nucleophile which opens the imide ring of the reduced imide and chemically combines with a carbonyl atom of the opened imide ring to form an imide derivative.

I. Field of the Invention

This invention relates to derivatives of compounds containing a carbonyl group conjugated to an aromatic moiety and to processes for fabrication thereof, more particularly to imide and benzoyl materials more particularly to polyimide materials, more particularly, to forming a thioether, ester, an ether, a phosphate and a silylether derivative of a polyimide material, most particularly, to forming a silylether from a polyimide material.

II. Background of the Invention

Polyimides find extensive use in electronic applications where they are useful in forming dielectric films on electrical and electronic devices such as capacitors, semiconductors and semiconductor packaging structures. Typical uses for polyimide include protective coatings for semiconductors, dielectric layers for multilayer integrated circuits, dielectric layers for multilayer integrated circuit packages, high temperature solder masks, bonding multilayer circuits, final passivating coatings on electronic devices and the like.

It is well known in the polymer art to make thermally stable all-aromatic polyimides by the condensation polymerization of dianhydrides and diamines to form polyamic acid. These polyamic acids are readily dehydrated to the corresponding polyimides by heating at high temperatures, e.g. 300° to 400° C.

In electronic applications, a polyimide layer on an electronic device or package is generally fabricated by spinning onto the device or package a liquid polyamic acid. The polyamic acid is thereafter cured to form polyimide by applying heat or cured by chemical dehydration of polyamic acid using pyridine/acetic anhydride mixtures.

Polyimides are finding increased use as passivation and dielectric materials for integrated circuits and packaging, both for large and small systems. With the increasing demand for a greater wiring density in multilayer polyimide-based packages, it is important that through-holes and other patterns can be formed in the polyimide layers. Patterning is typically achieved by reactive ion etching (RIE) with chemical vapor deposited (CVD) $SiO_2$ or $Si_xN_y$ acting as an RIE mask.

Inorganic resists or silylation of certain organic photoresists is also used to make RIE etch barriers for polyimides. U.S. Pat. No. 4,357,369 describes a silicon containing resist material comprising a poly(silane sulfone) copolymer which can act as an oxygen plasma etch barrier. Polyimide containing silicon or attached siloxane groups can be used as RIE barrier.

Inventions herein are methods of derivatizing polyimide materials with oxygen, sulfur, nitrogen, phosphorus and silicon containing species yielding a polyimide material derivative from which the parent polyimide material can be readily regenerated.

The methods are particularly useful to generate a selectively silylated polyimide material to act as an etch barrier to form an etched pattern in the polyimide material. After the pattern is etched the polyimide material can be desilylated to regenerate the parent polyimide material.

The methods involve reduction of the imide moieties of the polyimide material, followed by reaction with an electrophilic agent, for example an electrophilic silylating agent. The electrophilic agent combines with the imide moiety of the polyimide material.

Prior art methods include incorporation of silicon into the backbone of the polyimide materials during the polycondensation reaction to form the polyimide material. These polymers are not polyimide derivatives. In the present invention silicon is added as part of a pendant group to the polyimide material.

U.S. Pat. No. 4,672,099 describes a polycondensation process to form a polyimide siloxane precursor using silicon containing diamines with anhydrides to include silicone in the backbone. The precursor can be crosslinked to form a polyimide siloxane.

U.S. Pat. No. 4,586,997 also describes a polyimide material containing silicon in the backbone where the silicon-containing unit is copolymerized as an amine which is subsequently condensation polymerized with anhydride.

U.S. Pat. No. 4,140,572 describes similar polymers as described in U.S. Pat. No. 4,586,997.

U.S. Pat. No. 4,675,367 describes the preparation of silylpolyamides prepared by reacting a silylanhydride or imide, preferably a polysiloxane anhydride with a lactam.

U.S. Pat. No. 3,288,754 describes a method of silicon modification of a polyamide-polyimide polymer by a polycondensation reaction of a soluble polyamide-polyimide prepolymer containing aromatic carboxylic acid groups with a silicon-containing material also either containing an amine, 1,2-epoxide or isocyanate group such that an amide or ester can be generated or curing the polymer by heating the resultant structure containing imide-amide on silicon containing units.

It is an object of this invention to provide derivatives of imide materials and the methods of fabrication thereof.

According to the present invention, the preferred starting material is a polyimide from which a polyimide derivative, for example, a polyimide silylether, is fabricated. The present invention is particularly useful for polyimide materials which are not soluble in commonly available solvents. According to the present invention a polyimide material is reduced which makes it soluble in aprotic solvents without changing the chemical properties of the polyimide. The reduced polyimide is contacted with an electrophile which attacks the reduced polyimide material forming a thioether, a ester, an ether, a phosphate and a silylether.

It is another object of this invention to provide derivatives of polyimide materials and the methods of fabrication thereof.

It is another object of this invention to fabricate a polyimide derivative by first reducing the polyimide material and treating the reduced polyimide to a electrophilic reagent.

It is another object of this invention to provide a polyimide material derivative selected from the groups of a thioester, an ester, a ether, a phosphate and a silylether.

It is another object of this invention to selectively form a derivatized polyimide material.

It is another object of this invention to selectively silylate a polyimide material.

SUMMARY OF THE INVENTION

In its broadest aspect, the present invention provides derivatives of compounds containing a carbonyl group conjugated to an aromatic moiety and methods of fabrication thereof.

In particular, compounds containing a carbonyl group conjugated to an aromatic moiety useful in the practice of the present invention are imide compounds and benzoyl compounds and most particularly, polyimide compounds.

In particular, according to one aspect of the present invention electrons are provided to the carbonyl group conjugated to an aromatic moiety. The carbonyl group conjugated to an aromatic moiety with the electrons thereon is treated with an electrophile containing at least one anionic leaving group. The electrophile chemically combines with the carbonyl group conjugated to the aromatic moiety. Protons or hydrogen atoms are extracted from the resulting composition to form the derivative.

In a more particular aspect of the present invention, the electrophile is an organic or inorganic compound having one or more atoms selected from the group consisting of S, C, P and Si with one or more anionic leaving groups bonded to these atoms.

In a more particular aspect of the present invention, the electrophile has general structural formula:

$$R'(R_s^4 Y_t X_m)_n$$

wherein R' is an organic or inorganic radical; wherein $R^4$ is a monovalent or polyvalent organic radical preferably selected from the group of an aliphatic radical, a substituted aliphatic radical, an aromatic radical, a substituted aromatic radical, a heterocyclic radical a substituted heterocyclic radical and combinations thereof. Y is selected from the group consisting of S, C, P and Si. The derivative being a thioether, an ether, an ether, a phosphate and a silylether respectively or combinations thereof. X is an anionic leaving group. Each member of the group of R', $R^4$, Y and X forms at least one chemical bond with at least one other member of the group and $s \geq 0$, $t \geq 0$, $m \geq 1$ and $n \geq 1$, wherein n is the number of reactive centers on the electrophile.

In another more particular aspect of the present invention, electrons are supplied to the imide material by a chemical or electrochemical reduction process.

In another more particular aspect of the present invention, a material surface containing carbonyl groups conjugated to an aromatic moiety can be selectively derivatized by selectively supplying electrons to the material surface.

Another particular aspect of the present invention is a monosubstituted imide derivative having structural formula:

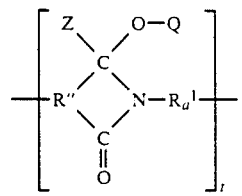

and a disubstited derivative having structural formula:

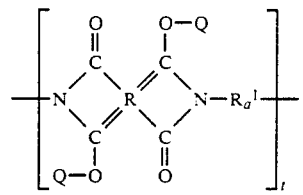

wherein $R^1$ is an organic radical; wherein a is 0 or 1; wherein R' is an organic or inorganic radical; wherein t is $\geq 1$ and preferably less than about 100,000; wherein R is a tetravalent organic radical; wherein R" is an organic radical; wherein $R^4$ is at least one from the group of an aliphatic radical, a substituted aliphatic radical, an aromatic radical, a substituted aromatic radical, a heterocyclic radical, a substituted heterocyclic radical and combinations thereof; wherein Q is an organic or inorganic radical; wherein Q preferably contains S, C, P and Si; wherein Q more preferably is organic; wherein Q most preferably is a radical having general structure formula $-Y(R^5_{(m-1)}Y_{(t-1)}R_s^4)(R_m^5 Y_t R_s^4)_{(n-1)}R'$; wherein $R^5$ is selected from another molecule or a repeat unit of the same or another of molecule of said compound; wherein R' and Y are defined above; and wherein z is an electron donor.

These and other objects, features and advantages will be apparent from the following more particular description of the preferred embodiments.

DETAILED DESCRIPTION OF THE PREFERRED Embodiments

The inventions will be described with reference to polyimide materials as the referred materials. The inventions are applicable to any material or compound containing a carbonyl group conjugated to an aromatic moiety. This group is shown in the following equation:

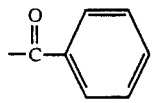

Aromatic imide compounds and benzoyl compounds contain this group. This group is also referred to as a redox site herein.

The first step of the process of the invention is directed to introducing electrons at the imide functionality of a polyimide material.

The organic polymeric materials treated pursuant to the present invention are capable of being reduced, i.e. accept electrons. In particular, such polymers are polyimide which include polyimides, and modified polyimides. The Encyclopedia of Chemical Technology Third Edition article entitled, "Polyimides", Vol. 18, p. 704–719, the teaching of which is incorporated by reference, describes various polyimide materials including homopolymers. The polyimides are of interest in view of their continually expanding use in electronic devices and packaging and their widespread availability. Discussion of various electrochemical properties concerning polyimides can be found in U.S. Pat. No. 4,512,855 to Mazur; Haushalter, et al., "Thin Solid Films", 102, 161 (1983); Mazur, et al., "Electrochemical Society, Electrochemical Science and Technology", pp. 346–353, February 1987; and Mazur, et al., "Electrochemical Growth of Metal Interlayers and Polyimide Film", Journal of Physical Chemistry, 1986, 90, pp. 1365–1372. electrons from another material or chemical entity at a finite rate without itself undergoing a change which limits this capacity. The chemical entity may be molecular, ionic, atomic, or adjacent redox sites within or in contact with the polymer. The redox potential of the polymer is positive to the reduction potential of the chemical entity, thereby permitting the polymer to readily accept electrons. The polymer must possess chemical functionality (redox sites) whose redox potential is positive relative to the reduction potential of the chemical entity. Examples of such functional groups include the aromatic imide groups of modified and unmodified polyimides. The groups, as discussed above, are compatible with chemical entities whose reduction potentials are more positive than the oxidation potential of the reduced electroactive polymer.

In addition, the polymer functionality must be reversibly redox active, that is, capable of accepting and donating electrons rapidly and without competing, irreversible chemical changes. This reversibility may require such precautions as exclusion of oxygen or potential proton donors. The polymer must also be able to take up sufficient solvent by swelling or absorption to permit diffusion of electrolyte ions into the polymer.

Preferably, the polymer should have a molecular weight sufficient that films of the material will maintain mechanical integrity in an material will maintain mechanical integrity in an electrolyte solution. The molecular weight required depends on the structure of the polymer and solvent and should generally be greater than 5,000–10,000 daltons.

The polyimides that can be treated in accordance with the present invention include unmodified polyimides, as well as modified polyimides such as polyester imides, polyamide-imide-esters, polyamide-imides, polysiloxane-imides, as well as other mixed polyimides or polyimide blend materials. Such are well known in the prior art and need not be described in any great detail.

Generally, the polyimides include the following recurring unit:

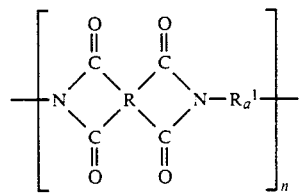

where n is an integer representing the number of repeating units to provide a molecular weight usually about 10,000 to about 100,000. R is at least one tetravalent organic radical selected from the group consisting of:

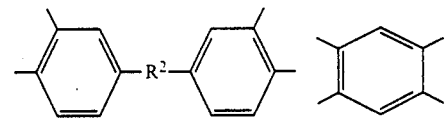

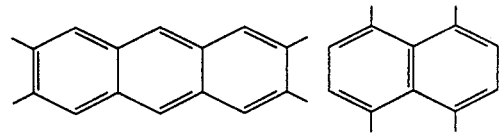

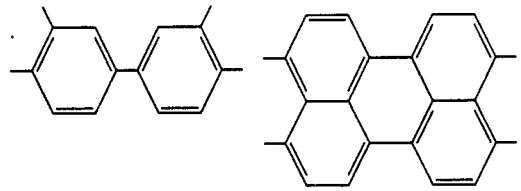

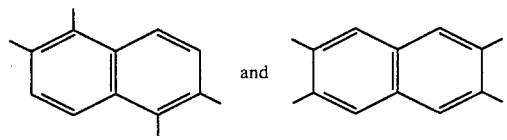
and $R^2$ being selected from the group consisting of divalent aliphatic hydrocarbon radicals having from 1 to 4 carbon atoms and carbonyl, oxy, sulfo, sulfide, ether, siloxane, phosphine oxide, hexafluoroisopropylidene and sulfonyl radicals and in which a=0 or 1 and in which $R^1$ is preferably at least one divalent radical selected from the group consisting of an aliphatic organic radical or from the group shown:

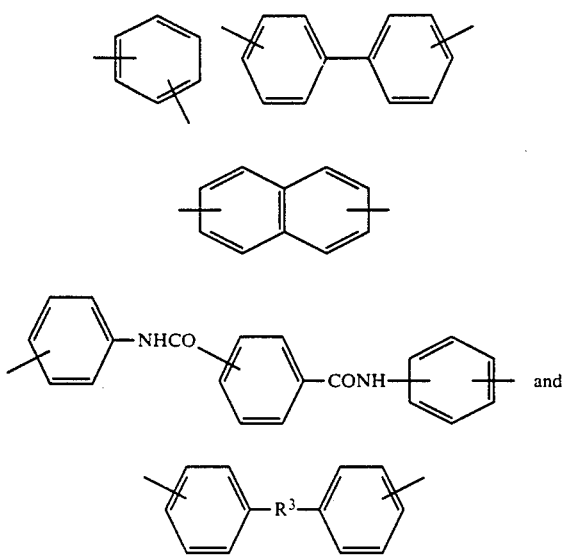

in which $R^3$ is a divalent organic radical selected from the group consisting of $R_2$, silico, and amino radicals. Polymers containing two or more of the R and/or $R^1$ radicals, especially multiple series of $R^1$ containing amido radicals, can be used.

Generally, the polyimides having monoimide units have the following recurring units:

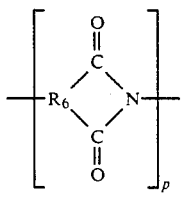

where $R^6$ is trivalent and p is an integer representing the number of repeating units to provide a molecular weight usually about 10,000 to 100,000. Examples of monoimide polyimides are given in "The Encyclopedia of Chemical Technology Third Edition" article incorporated herein by reference supra.

Polyimides are available commercially from a variety of suppliers in one of three forms: a) as solutions of the polyamic acid precursors (e.g., DuPont Pyralin); b) as pre-imidized film (e.g., DuPont Kapton film); or c) as pre-imidized powders (e.g., Ciba-Geigy Matrimid 5218) or solutions (e.g., Ciba-Geigy Probimide). The chemistry of commercial polyimides includes examples of many of the components listed above, but a preferred polymer for use pursuant to the present invention is based on the monomers pyromellitic dianhydride (PMDA) and oxydianiline (ODA), also named 4 amino phenylether. Other preferred polymers for use pursuant to the present invention are the polymers of benzophenonetetracarboxylic dianhydride (BTDA) and ODA and/or 1,4-phenylenediamine and polymer of 3,3'-biphenylenetetracarboxylic acid dianhydride(BPDA) and 1,4-phenylenediamine (PDA). Polyimide films based on PMDA-ODA are available from Allied Corporation under the tradename Apical ® and from DuPont under the tradename Kapton ®. Films based on BPDA-PDA are available from Ube Corporation as Upilex ® and from Hitachi Chemical Company as PIQ-L100 ®. Other tradename polyimides useful pursuant to the present invention include Durimid ® from Rogers Corporation and the DuPont Pyralin ® series, including PI-2525 and PI-2566. The Upilex ® polyimides, although possessing higher thermal and dimensional stability than the Kapton polyimides, have not been widely used in integrated circuit packaging because of the absence of efficient wet etching processes for such polyimides.

The electrons can be provided by means of a cathode in an electrochemical circuit, the potential applied to the cathode being equal to or negative of the reduction potential of the polymer or preferably by means of a reducing agent in solution. The oxidation potential of the reducing agent must be negative with respect to the reduction potential of the polymer.

With respect to the polyimides, the imide functional groups of the polymer can be reduced (by one electron) to the radical anion, or reduced (by two electrons) to the dianion or diradical dianion or reduced (by three electrons) to the radical trianion as illustrated in the following reaction scheme for 3,3',4,4'-benzophenone tetracarboxylic diimide functional group where $e^-$ is an electron and $C^+$ is a counter cation. The polyimide can have more than three functional groups. When there are an odd number of functional groups and each is reduced by one electron the resultant reduced polymer is a radical anion. When there are an even number of functional groups and each is reduced by one electron the resultant reduced polymer is an anion.

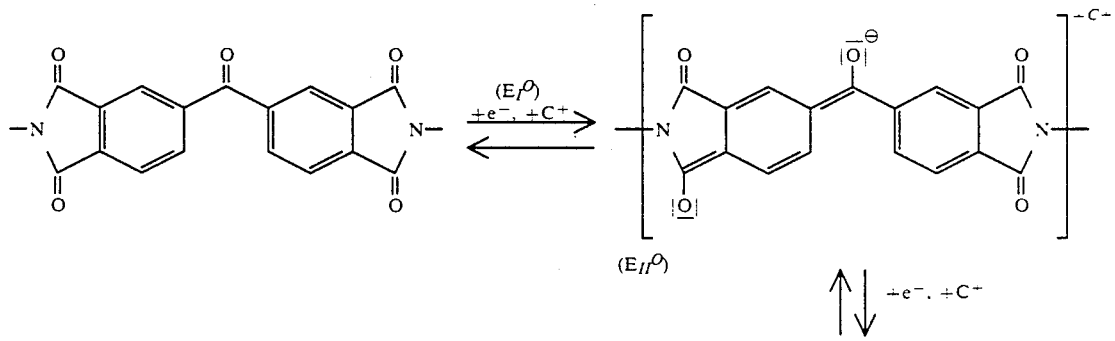

-continued

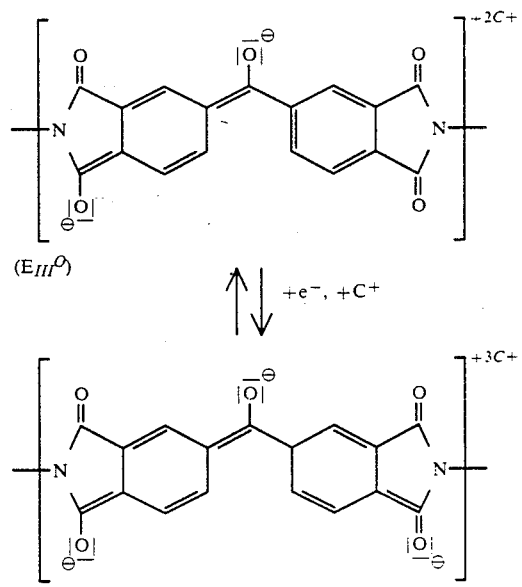

($E_{III}{}^O$)

The following reaction illustrates the reduction of PMDA-ODA diimide functional group where $e^-$ is an electron and $C^+$ is a counter cation to the radical anion and dianion form.

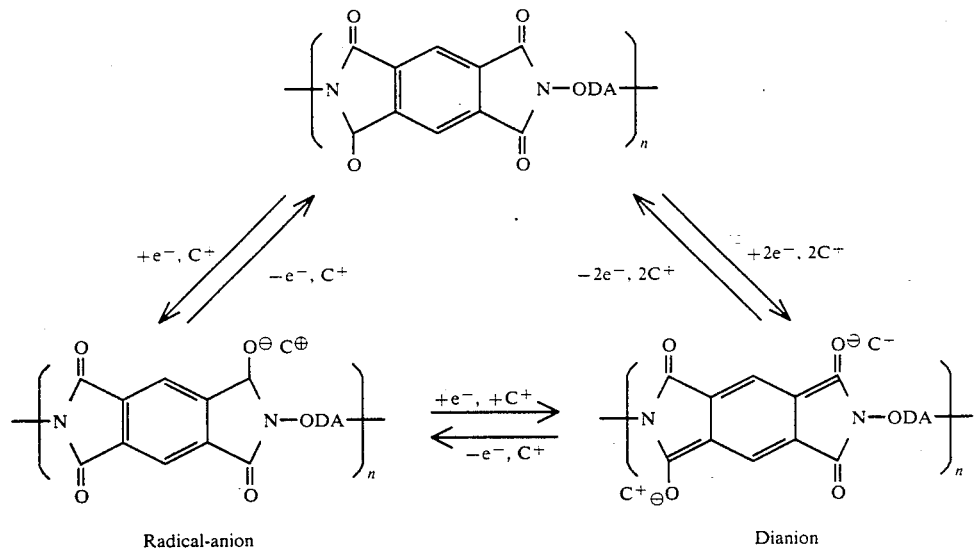

According to preferred aspects of the present invention, the reduction is achieved by means of a reducing agent that has an oxidation potential negative with respect to the reduction potential of the polymer. With respect to polyimides, compounds such as benzil anion, anthraquinone anion, benzophenone anion, benzoin dianion, alkali metals of naphthalenide, anion of N,N'-di-n-butylpyromellitimide and even solvated electrons generated, for example, in liquid ammonia can be used as the reducing agent.

The reducing agents can be reducing agents per se, or produced such as in situ by electrochemical means. The reducing agents can be generated by chemical reaction such as by reacting benzoin and potassium tert-butoxide or be a compound having a strong electron donating power such as tetrakis(dimethylamino)ethylene (TKDE).

Examples of suitable organic compounds that can be electrochemically reduced to provide the chemical reducing agent include, but are not limited to, the following groups of compounds: unsaturated aromatic hydrocarbons (e.g., anthracene), aldehydes and ketones (e.g., N-n-butylphthalimide, N,N'-di-n-butyl-3;3',4,4'-biphenyl tetracarboxylic diimide), carbodiimides (e.g., bis-(chlorophenyl carbodiimide), aromatic heterocyclic nitrogen compounds (e.g., 9,10-diazaphenanthrene), anhydrides (e.g., 1,8-naphthalic anhydride, 3,3',4,4'benzophenone tetracarboxylic dianhydride), quinone (e.g., 9,10-anthraquinone), quaternary aromatic nitrogen compounds (e.g., 1-ethylpyridinium bromide), azomethines (e.g., N-p-biphenylbenzylimine), immonium salts (e.g., N-ethyl-N-methyl benzophenone immonium salt), azo compounds (e.g., 4,4'-azobiphenyl), amine oxides (e.g., acridine N-oxide), nitro and nitroso compounds (e.g., 2-t-butylnitrobenzene), and organometallic compounds (e.g., diphenylchromium (I) iodide).

Benzil, 9-flourenone, benzophenone and anthracene are examples of specific compounds that can be reduced to provide the chemical reducing agents suitable for carrying out the present invention. The compounds can be reduced by applying such to an electrochemical cell containing an anode and a cathode and then applying a voltage.

The compounds can be reduced electrochemically or by bulk electrolysis. Typically, this is done using a two-compartment cell whereby the compartments are separated by a sintered glass disk or frit having a porosity of less than 8μm. A salt bridge or semi-permeable membrane also could be used to separate the compartments. The working compartment is housed with a cathode electrode which is comprised of a metal such as platinum, carbon, or stainless steel. For potentiostatic operation, an appropriate reference electrode is positioned in the working compartment (e.g., Ag/0.1 M AgNO₃). The cell can be purged with an inert gas such as N₂ or argon using an inlet tube and one-way valve or operation can be done in a glove box under an inert atmosphere.

Electrochemical generation of the reducing agent is accomplished by either galvanostatic, potentiostatic, or voltage-controlled electrolysis. Typically, the current density range for galvanostatic reduction is 0.1 to 2 mA/cm². In potentiostatic mode, reduction is typically done by applying a potential to the cathode which is more negative (e.g. −50 mV or more) than the reduction potential for the organic compounds as measured against the same reference electrode.

Compounds such as potassium tert-butoxide can react with aromatic ketones and alcohols to form anionic species. For instance, potassium tert-butoxide reacts with benzoin to form the benzoin dianion.

In addition, the composition used to reduce the polymer will include in the solution a supporting electrolyte and preferably a supporting electrolyte salt that contains as cation a member from one of the following groups: tetraalkylammonium, tetraalkylphosphonium, alkali metal, aryl-alkylammonium, aryl-alkylphosphonium, or chelated metal. The preferred tetraalkylammonium group is tetrabutylammonium, but other tetraalkyls with alkyl group being methyl, ethyl, propyl, isopropyl, pentyl, hexyl, or mixed alkyl thereof can be employed if desired. An example of a typical aryl group is phenyl and an aryl-alkylammonium is benzyltributylammonium. An example of a chelated metal cation is potassium 18-crown-6. The supporting electrolyte salt preferably contains as anion one of the following: tetrafluoroborate, hexafluorophosphate, aryl sulfonate, perchlorate, or halide such as bromide or iodide.

The electrolyte solution is preferably comprised of an aprotic solvent. The aprotic solvents suitable for use in this invention include, but are not limited to, the following: nitrile and nitro compounds (e.g., acetonitrile, benzonitrile, nitromethane), amide and cyclic amide compounds (e.g., N,N-dimethylformamide, N-methylformamide, N,N-diethylformamide, N-ethylformamide, N,N-dimethylacetamide, N-methyl-2-pyrrolidinone, hexamethylphosphoramide, ester, cyclic ester and ether compounds (e.g., propylene carbonate, ethylene carbonate, γ-butyrolactone, ethyl acetate, tetrahydrofuran, 1,4-dioxane dimethylether, oxide and sulfo compounds (e.g., dimethylsulfoxide, acetone, liquid sulfur dioxide, sulfolane, dimethylsulfone).

The reducing agents generated electrochemically, according to the present invention, are typically neutral organic molecules which are electrochemically charged, thereby transferring electrons to the polymer, thereby reducing it. The electron transfer returns the reducing agent back to its neutral state. This is in sharp contrast to those reducing agents such as Zintyl complexes that result in anions remaining with the polymer or are intercalated.

It has also been found, pursuant to the present invention, that the electrons can be supplied by contacting the polymeric material with tetrakis(dimethylamino)ethylene (TKDE). Tetrakis(dimethylamino)ethylene is represent by the formula:

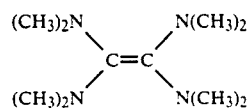

The TKDE can be used as such or employed in solution with an organic solvent including the aprotic solvents discussed above. Also, protic solvents such as water and alcohols including methanol, ethanol, and ethylene glycol can be used provided such are made alkaline (e.g.—adding a base). The TKDE reduces sites of the polymeric material to, for example, the radical anion form while it is concurrently oxidized to a cation form. The TKDE cations function as counter-ions to balance the charge imparted to the polymer in order to maintain electroneutrality throughout the polymer. The oxidized TKDE (cation) can subsequently be regenerated to neutral TKDE, for example, by reductive electrolysis. This material can function as the solvent and counter-ions in addition to its reducing agent function.

The polyimide, which, after being reduced by the reducing agent contains a region of reduced polyimide near the exposed surface, can then be exposed to a solution of the electrophile in order to open at least one of the imide rings in the polyimide repeat unit.

The electrons can be supplied to the redox sites of polymeric material also by employing electrochemical means. In particular, the process involved requires providing the polymer onto a metal electrode which, when negatively biased, acts as a cathode in the circuit. An alternative approach is to contact the polymer surface to be reduced with a cathodic electrode in an electrochemical cell.

A typical arrangement to carry out this particular procedure pursuant to the present invention is illustrated in U.S. Pat. No. 4,512,855.

The combination of the electrode and polymeric film is then immersed into an electrolyte solution in an aprotic solvent.

In addition, the composition used to reduce the polymer will include in the solution a supporting electrolyte and preferably a supporting electrolyte salt that contains as cation a member from one of the following groups: tetraalkylammonium, tetraalkylphosphonium, alkali metal, aryl-alkylammonium, aryl-alkylphosphonium or chelated metal. The preferred tetraalkylammonium group is tetrabutylammonium, but other tetraalkyls with alkyl group being methyl, ethyl, propyl, isopropyl, pentyl, hexyl or mixed alkyl thereof can be employed if desired. An example of a typical aryl group is phenyl and an aryl-alkylammonium is benzyltributylammonium. An example of a chelated metal cation is potassium 18-crown-6. The supporting electrolyte salt preferably contains as anion one of the following tetrafluoroborate, hexafluorophosphate, arylsulfonate, perchlorate or halide such as bromide or iodide.

The electrolyte solution is preferably an aprotic solvent. The aprotic solvents suitable for use in this invention include, but are not limited to the following: nitrile and nitro compounds (e.g., acetonitrile, benzonitrile, nitromethane), amide and cyclic amide compounds (e.g., N,N-dimethylformamide, N-methylformamide, N,N-diethylformamide, N-ethylformamide, N,N-dimethylacetamide, N-methyl-2-pyrrolidone, hexamethylphosphoramide), ester, cyclic ester, and ether compounds (e.g., propylene carbonate, ethylene carbonate, γ-butyrolactone, ethyl acetate, tetrahydrofuran, dimethylether), oxide and sulfo compounds (e.g., dimethylsulfoxide, acetone, liquid sulfur dioxide, sulfolane, dimethylsulfone).

In the event that the electrons are supplied to the polymeric film by a cathode in an electrochemical circuit, the potential applied to the cathode must be equal to or negative of the reduction potential of the polymer for which typical values are given below.

The first electron reduction potential $E_o$ for various polyimides are given:

|  |  | $E_o$ |
| --- | --- | --- |
| PMDA-ODA[4] | (Kapton ®) | −0.78 |
| BPDA-PDA[5] | (Upilex ®) | −1.34 |
| BTDA-DAPI[1] | (XU-218 ®) | −1.04 |
| BTDA-APB[3] | (Thermid ®) | −0.96 |
| NTDA-ODA[2] | | −0.64 |

$E_o$ is referenced versus the saturated calomel electrode and determined by cyclic voltammetry in 0.1M tetrabutylammonium tetrafluoroborate in acetonitrile.
[1]BTDA-DAPI is 3,3',4,4'-benzophenone tetracarboxylic dianhydride-diamino-1,3,3-trimethyl-1-phenylindan which is commercially available from Ciba-Geigy under the tradename XU-218 ®.
[2]NTDA-ODA is 1,4,5,8-naphthalene tetracarboxylic dianhydride-4,4'-oxydianiline.
[3]BTDA-APB is 3,3'-4,4'-benzophenone tetracarboxylic dianhydride-1,3-bis-(2-aminophenoxy)benzene is commercially available from National Starch and Chemical Company under the tradename Thermid ®.
Kapton ® is trademark of DuPont.
Upilex ® is trademark of Ube.

If the polyimide material is in a liquid form it can be added to a solution with the solvents above and reduced by the chemical or electrochemical methods described herein above. If the polyimide material is not soluble in the solvent, the insoluble polyimide can be placed into an aprotic solvent as described herein above and reduced by the chemical and electrochemical methods described herein above. Reduced polyimide will then become soluble in the aprotic solvent. Examples of polyimides which are not directly soluble in commonly available solvents are polyimide materials based on PMDA-ODA (pyromellitic dianhydride-oxydianiline) and BPDA-PDA (3,3'-biphenylenetetracarboxylic acid dianhydride 1,4-phenylenediamine). Examples of polyimides which are soluble in the commonly available solvents are Thermid ®, XU-218 ®.

The present invention is not limited to chemical and electrochemical methods for reducing the polyimide described herein above. Any method of providing electrons to the imide functional groups of the polyimide can be used to practice the present invention.

Although applicants do not want to be limited to a specific mechanism, applicants believe that the process of the invention can be summarized by the following two sequences of equations. The first sequence, in equation 1 shows a polyimide material reduced to the radical anion form and treated in equation 2 with an electrophilic reagent. The second sequence, in equation 6 shows that polyimide material reduced to the dianion form and treated with an electrophilic reagent in equation 7. It will be readily recognized by an artisan that a polyimide material reduced to a trianion form will proceed by a combination of the first and second sequence. For simplicity a simple bidentate electrophile, XYR$^4$YX, is shown in the first and second reaction sequence: the two X's can be the same or different leaving groups; the two Y's can be the same or different Y atoms. R is defined above. The X's and Y's are assumed for simplicity to have a valence having magnitude 1. It will be apparent to those of skill in the art how sequence 1 and 2 is to be modified for a nucleoplite having general formula given below.

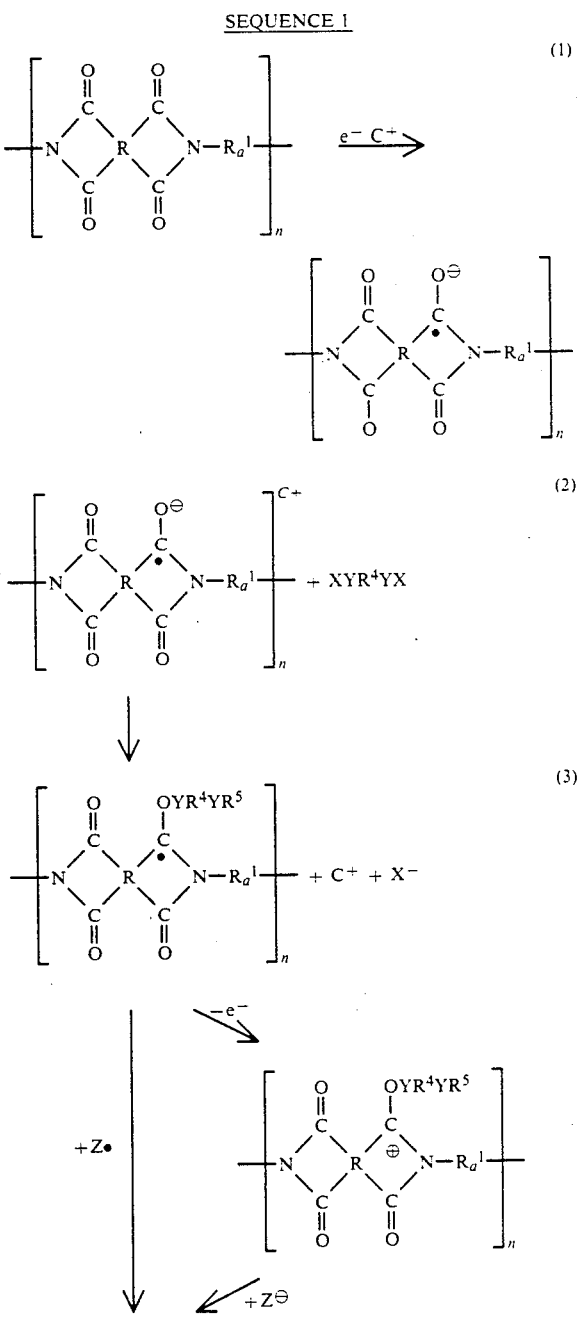

-continued
SEQUENCE 1

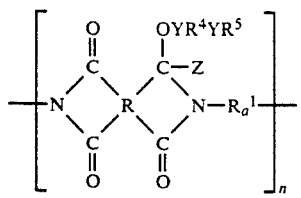

SEQUENCE 2

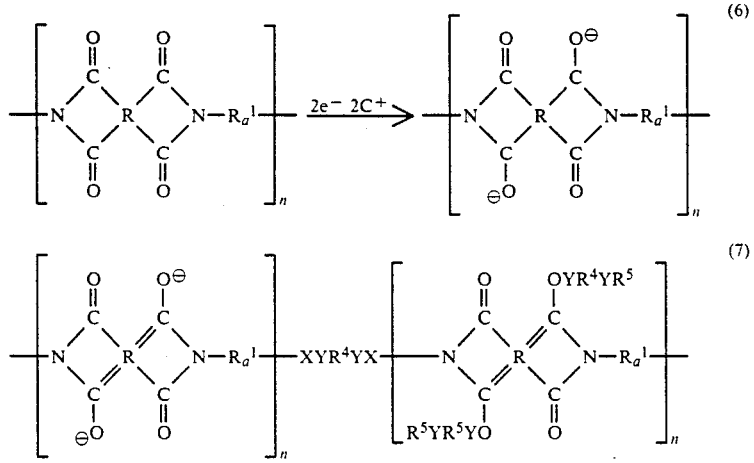

The second step of the process of the invention (equation 2 of sequence 1 and equation 7 of sequence 2) is directed to exposing the reduced polyimide material to an electrophilic reagent to form the derivatives of the present invention. It is believed that the electrophilic reagent attacks the oxygen atom of the reduced polyimide.

Electrophiles useful to practice this invention preferably have the following structural formula:

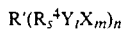

$R'$ is an organic or inorganic radical; $R^4$ is selected from at least one of the groups consisting of an aliphatic radical, a substituted aliphatic radical, an aromatic radical, a substituted aromatic radical, a heterocyclic radical, a substituted heterocyclic radical and combinations thereof. Y is selected from the group of S, C, P and Si. X is an anionic leaving group, preferably selected from the group of tosylates, brosylates, nosylates, mesylates, triflates, nitrogene, amylesters and halide ions $F^-$, $Cl^-$, $Br^-$ and $I^-$. The most preferred leaving groups being the halide ions. Each member of the group of $R'$, $R^{4,}$ Y and X forms at least one chemical bond with at least one other member of the group and $s \geq 0$, $t \geq 0$, $m \geq 1$ and $n \geq 1$, wherein n is the number of reactive centers on the electrophile, wherein preferably n, s, t, $m \geq 10$, wherein most preferably n, m, $t \geq 4$ and $s \geq 6$. When $n=1$, the electrophile is monodentate, when $n=2$ the electrophile is bidentate and when $n>1$, the electrophile is polydentate. A polydentate electrophile can have more than one type of Y atom. One of the Y atoms can chemically bond with the reduced carbonyl group of the molecule to be derivatized.

In solution the anionic leaving group leaves the electrophile. As shown in equation 2 and 3 of sequence 1 and equation 7 of sequence 2, it is believed that the RY-cation chemically attacks the carbonyl oxygen of the reduced carbonyl group and chemically combines with the oxygen atom. The counter cation $C^+$ and the anionic leaving group $X^{-r}$ form an ionic compound in solution, which may or may not be soluble.

Where the electrophile is monodentate and the anionic leaving group $X^{-r}$ has a value of r greater that 1 or where there is more than one leaving group the RY-cation, $Y(R^4)^{+r.m}$ forms a chemical bond with the oxygen atom of the reduced carbonyl group. This leaves at least $q=r.m-1$ positive charges on the RY-cation which can chemically combine with another molecule or with q oxygen atoms of reduced carbonyl groups of different repeat units in the same or another reduced polyimide molecule which are represented by $R^{5.}$ Where the electrophile is polydentate one of the Y sites can react with the carbonyl group sites can be free for further chemical reactions.

If the electrophile is in liquid form it can be added to the solution containing the reduced polyimide in drop form. Excess electrophile can be added to solution or an artisan, knowing data about efficiency of the electrophilic reaction with various imide or benzoyl compounds can calculate the total quantity of electrophile needed to produce the desired degree of modification.

If the electrophile is in solid form, it is preferably solubilized in a solvent compatible with the solvent used for the reduced polyimide. Preferably, the solvent used to solubilize a solid electrophile will be the same solvent used for the reduced polyimide. Suitable solvents are listed herein above.

Examples of the aliphatic radical R, of the electrophile are: isocyanates, olefins, ketenes, acetylenes, nitriles, $X-CH_2-CH=CH_2-(CH_2)_n-CH_2-X$, $CH(CH_2)_n \ CH_2 X$

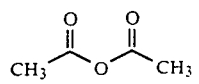

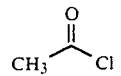

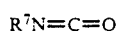

wherein X is halide and $R^7$ is aliphatic. The preferred being acid or alkyl chlorides and anhydrides and most preferred are chlorides. This list is exemplary only and not limiting.

Examples of the aromatic radical, of the electrophile are: phenyl or polyaromatic hydrocarbons, for example:

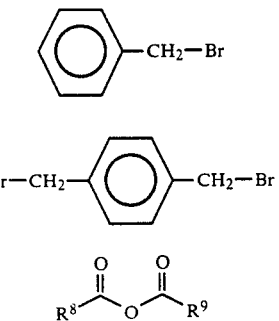

This list is exemplary only and not limiting.

Examples of the heterocyclic radical R, of the electrophile are:

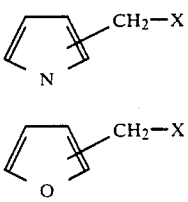

and polyfunctional analogues thereof, for example:

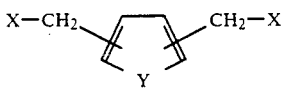

Wherein Y is selected from O, N and S and X is a leaving group as defined above. This list is exemplary only and not limiting.

Examples of electrophiles containing sulfur as the Y constituent are aromatic, aliphatic and mixed aromatic and aliphatic disulfides. The preferred is the lower aliphatic and aromatic disulfides. The most preferred is methyl disulfide or ethyl disulfide. This list is exemplary only and not limiting.

Examples of electrophiles containing carbon as the Y constituent are the same as the examples given for R above.

Examples of electrophiles containing phosphorous as the Y constituent are phosphorusoxychlorides and chlorodialkyl(aryl)phosphine. The most preferred is chlorodiphenylphosphine. This list is exemplary only and not limiting.

Examples of electrophiles containing silicon as the Y constituent are silylhalides and linear and cyclic silazanes; the preferred are silyl chlorides, hexamethyldisilazane and hexamethylcyclotrisilazane and the most preferred is trimethylsilylchloride.

The X constituent of the electrophile is an ionic leaving group. The X constituent readily dissociates from the R-Y moiety of the electrophile in solution.

The artisan will recognize that the degree of derivitization desired depends on the concentration and reactivity of the electrophile in the solution. The reduced polyimide species can withstand elevated temperatures. At elevated temperatures the reaction rate of the electrophile increases.

The artisan will recognize that details on the concentrations of solvents and counterions depend on the electrophile and compound being derivatized. It is within the skill of the art to provide these details. The reduction potential of the electrophile is more negative than the oxidation potential of the reduced carbonyl group conjugated to an aromatic group e.g. imide materials. This condition precludes electron transfer from the reduced material to the electrophile before chemical reaction. Preferably oxygen or oxidizing species are excluded during reaction to avoid oxidizing the reduced species.

The preferred electrophiles are the organic silyl species.

Treatment of the anion radical form with an electrophile as shown is equation 2 leaves a mono-substituted product with a single unpaired electron as shown in equation 3. This radical can be quenched by a radical trapping agent M such as a hydrogen atom or an alkyl radical. A hydrogen atom can be generated in solution for example by addition of 1,4-cyclohexadine to the solution. Other trapping agents are tri-n-butyltin hydride and spin trapping agents. This list is exemplary only and not limiting.

Alternatively the radical can be electrochemically oxidized and a hydride ion can be added to the solution such as sodium borohydride, lithium borohydride or a free radical scavenger such as galvin oxyl.

The preferred radical trapping agents are alkyl radicals having from 1 to 3 carbon atoms. The most preferred radical trapping agents is a hydrogen atom.

Alternatively, the single unpaired electron of the monosubstituted product can be oxidized to remove the extra electron, for example by bulk electrolysis at a platinum electrode. An electron donor $Z^-$ quenches the resulting cationic form of equation 4 to form the structure of equation 5. Examples of electron donors are hydride donors mentioned above carbonions such as methyl lithium and butyl lithium.

Treatment of the dianion form of equation 6 with an electrophile as shown in equation 7 forms a disubstituted ether adduct between the electrophile and the polyimide material. When the polyimide material is a PMDA polyimide material, the PMDA unit is left neutral and in quinoid structure. This structure assignment is supported by Fourier transform (FTIR) infrared spectrometry and ultraviolet - visible spectrophotometry. When the dianion is silylated, the FTIR spectrum shows new peeks attributable to Si—O, C=C and ether bonding as well as decreased aromaticity of the PMDA phenyl ring.

The Y—O ether bond of equations 3 and 7 are susceptible to hydrolysis in the presence of a protic solvent or proton donor. Examples of aprotic solvents are listed above. Examples of proton donors are acids such as hydrochloric acid.

The preferred proton donors are aqueous solutions of mild acids, water and acetic acid.

The polyimide starting material can be regenerated from the dianion through a hydrolytic process by cleaving the O—Y ether bond. The derivative can be exposed to aqueous acetic acid resulting in cleavage of the O—Y bond.

The final product of the process of the present invention is represented by the structural formula which is the product of equation 5 and 7. In the preferred embodiment $R^4$ is an alkyl radical, Y is a silicon atom, X is a chlorine anion and n=4 and m=3. In the most preferred embodiment of the present invention the electrophile is trimethylsilylchloride wherein $R^4$ is a methyl radical and Y is a silicon atom. The product of equation 5 of the invention being a silyl ether adduct and the product of equation 7 being a silyl enol ether adduct.

In the most preferred embodiment of the invention R in the polyimide material is a benzophenone or biphenyl radical.

The product of equation 3 and 7 can be used as an intermediate product for further chemical reactions, in particular where the electrophile is polydentate. When the electrophile has more than one reactive sites one of the reactive sites can react with the carbonyl group of the compound having the carbonyl group conjugated to the aromatic moiety while the other reactive sites are free for other chemical reactions. For example when Y is a silicon atom and when the surface of a polyimide body is modified, the modified polyimide surface can be exposed to an $O_2$ on $O_2/CF_4$ reactive ion etch process to oxidize the surface creating an etch stop layer for a subsequent polyimide etch step. When the electrophile is polydentate and one Y is a carbon atom, the electrophile can provide a cross-linking or copolymerization location. The electrophile may also contain a photoactive group, for example an azo or diazo group. When the electrophile is polydentated and one of the Y is a nitrogen atom, the nitrogen containing derivative can be used to cure, in situ an epoxy deposited thereon. Also, a nitrogen containing electrophile can make a hydrophobic surface hydrophilic. When the electrophile is polydentate and one of the Y is a sulfur atom or a phosphorous atom, it can be used as a chelating agent for metals such as copper, nickel, palladium or other seed metals.

If the derivative is in solution it can be separated by commonly known extraction and precipitation methods.

The reduced polyimide material according to equation 6 of the present invention can have the added electrons in either the 1,3 or 1,4 configuration. This is determined by the structure of the R constituent of the polyimide material. If R is a benzene radical, the electrons are added in the 1,4 configuration. This results in a polyimide derivative according to equation 7 of the present invention having the added groups in the 1,4 configuration.

For a polyimide material having naphthalene as the R constituent and the imide groups as part of a six element ring, the reduced form can have the cis or trans configuration as shown in the following equation:

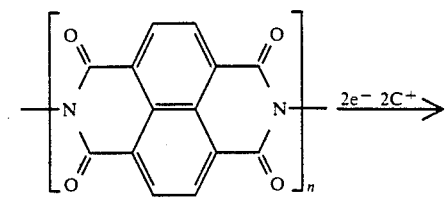

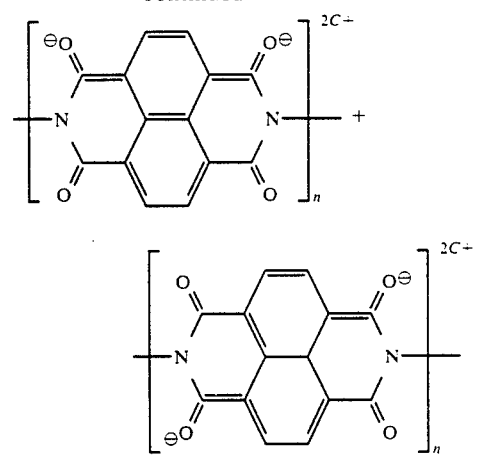

For a polyimide material having naphthelene as the constituent and the imide groups as part of a five member ring, the reduced form of the polyimide material has the 1,4 configuration shown in the following configuration:

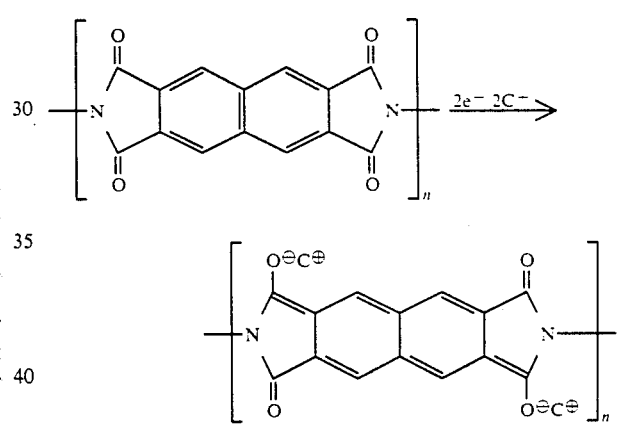

The above equations showing the 1,3 and 1,4 configurations for the particular polyimide material are exemplary only and not limiting.

Also, if desired, the polyimide material can be selectively treated according to the method of the present invention. For example, prior to reduction the polyimide material can be coated with a resist material (polymer, metal or other inert material) which cannot be activated by the process described above. Examples of a resist which are not reduced the way that the polyimide material is reduced are Waycoat ® SC (sold by Hunt Chemical Company) and KTFR ® (sold by Kodak, Inc.). The resist is selectively patterned and developed. Only where the resist is removed will the polyimide material be reduced upon exposure to the reducing agent. Metal patterns can be formed by standard lithographic and etching methods.

Silicon nitride can be used as a mask for the selective reduction of the polyimide material surface.

It has also been observed that polyimide material exposed to reactive ion etching (RIE) does not undergo effective reduction when exposed to the reducing agent according to the present invention, probably due to oxidation of the polyimide surface. Furthermore, the polyimide material exposed to RIE can again be rendered susceptible to reduction according to the present invention by treatment in a reducing gas, for example, treatment in a gas environment of about 3 to 10% hydrogen in nitrogen for about 15 to 30 minutes. Therefore, the polyimide exposed the RIE can be used as a mask for selective modification of the polyimide surface which has subsequently been treated in a gas environment described above, or by polyimide material not previously exposed to RIE.

The most preferred embodiment of the invention involves selective silylation of the surface of a polyimide material. The treated polyimide material surface is exposed to a reactive ion etch (RIE), for example an oxygen RIE or $O_2/CF_4$ mixture. The RIE converts the selectively silylated regions to an oxide material $SiO_2$ which is resistant to the RIE etch. The $O_2$ RIE etches the polyimide material in the regions which have not been silylated. An etch pattern is formed in the polyimide material.

It is to be understood that the above described embodiments are simply illustrative of the principles of the invention and fall within the spirit and scope thereof.

Having thus described the invention, we claim as new and desire to secure by Letters Patent is:

1. A method for forming a derivative of a compound having a carbonyl group conjugated at an aromatic moiety to form derivative compound selected from the group consisting of a substituted thioether, an ether, a phosphate and silylether comprising:

supplying at least on electron to said carbonyl group conjugated to an aromatic moiety;

contacting said conbonyl group conjugated to an aromatic moiety with said at least one electron thereon with an electrophile containing at least one atom selected from the group of S, C, P and Si;

there being at least one anionic leaving group bonded to said at least one atom;

said anionic leaving group leaves said atom providing a location at said atom to bond to said carbonyl group conjugated to an aromatic moiety with at least one electron thereon.

2. The method of claim 1, wherein electrophile has general structural formula:

$$R'(R_sY_tX_m)_n$$

wherein R' is an organic or inorganic radical; wherein R is at least one from the group of hydrogen, an aliphatic radical, a substituted aliphatic radical, an aromatic radical, a substituted aromatic radical, a heterocyclic radical, a substituted heterocyclic radical and combinations thereof;

wherein Y is selected from the group consisting of S, C, P and Si;

wherein X is a anionic leaving group;

wherein $s \geq 0$, $t \geq 0$, $m \geq 1$ and $n \geq 1$; wherein each member of the group of R', R, Y and X forms at least one chemical bond with at elast one other member of the group of R, R', Y and X; and wherein there is at least one X bound to one Y.

3. The method of claim 1, wherein said compound is selected from the group of an imide compound and a benzoyl compound.

4. The method of claim 3, wherein said imide compound is a polyimide compound.

5. The method of claim 4 wherein said polyimide compound is cured by any method by which imide ring cyclization can be obtained, including thermal and chemical dehydration curing.

6. The method of claim 5, wherein said polyimide compound is a free-standing or supported film derived from a dianhydride selected from the group of pyromellitic dianhydride, 3,3', 4,4-benzophenonetetracarboxylic dianhydride, 3,3'-biphenylenetetracarboxylic dianhydride, 1,4,5,8-naphthalenetetracarboxylic dianhydride, perylenetetracarboxylic dianhydride, 4,4'-(hexafluoroisopropylidene)-bis-phthalic anhydride, and bis(3,4-dicarboxyphenyl) sulfide dianhydride.

7. The method of claim 4, wherein said derivative is a silyleter, said Y constituent of said electrophile is Si and said compound forms a polyimide body, further including selectively derivatizing a surface of said body.

8. The method of claim 7, wherein said electrophile is the trimethylsilylchloride.

9. The method of claim 8, further including etching the regions of said polyimide body surface which are free of silyl species.

10. The method of claim 9 wherein said regions free of silyl species are etched by an RIE etch.

11. The method of claim 10 wherein said RIE etch is an $O_2$ RIE etch.

12. The method of claim 7 further including exposing said silyl species to dilute acid to regenerate said polyimide material.

13. The method of claim 1, wherein said anionic leaving group is selected from the group consisting of halide ions tosylates, brosylates, mesylates, triflates, nitrogene and arylesters.

14. The method of claim 1, wherein said electrons are supplied to said carbonyl group conjugated to said aromatic moiety by contacting said compound with a solution containing a chemical reducing agent that is energetically disposed to transferring electron(s) to said carbonyl group conjugated to said aromatic moiety without causing said chemical reducing agent to remain with said compound.

15. The method of claim 14 wherein said chemical reducing agent is a neutral organic compound whereby all or a portion of the said neutral organic compound has been electrochemically reduced in an aprotic solvent containing a supporting electrolyte salt.

16. The method of claim 15 wherein said neutral organic compound is at least one species selected from the group of unsaturated aromatic hydrocarbons, aromatic carbonyl compound, imides, diimides, carbodiimides, anhydrides, quinones, quaternary aromatic nitrogen compounds, azomethanes, immonium salts, azo compounds, amine oxides, nitro and nitroso compounds and organometallic compounds.

17. The method of claim 15 wherein said supporting electrolyte salt contains a cation which is at least on member of the group of tetraalkylammonium, tetralkylphosphonium, alkali metal, mixed alkyl-aryl ammonium, mixed alkyl-aryl phosphonium, or chelated metal and said supporting electrolyte salt anion is at least one member selected from the group of tetrafluoroborate, hexafluorophosphate, perchlorate, halide, aryl sulfonate and aromatic organic compounds.

18. The method of claim 15 wherein said supporting electrolyte salt contains at least one member selected from the group of tetrabutylammonium tetrafluoroborate, tetraethylammonium tetrafluoroborate, tetrabutylammonium hexafluorophosphate, tetraethylammonium bromide, lithium tetrafluoroborate, lithium perchlorate, benzyltributylammonium tetrafluoroborate and sodium naphthalenide.

19. The method of claim 15 wherein said aprotic solvent is at least on member selected from the group of nitriles, nitro compounds, amides, cyclic amides, amines, esters, cyclic esters, ethers, carbonates, oxides and sulfo compounds.

20. The method of claim 15 wherein the said aprotic solvent is selected from at least one member of the group of acetonitrile, N,N-dimethylformamide, N-methylformamide, N,N-diethylformamide, N-ethylformamide, N,N-dimethylacetamide, N-methyl-2-pyrrolidone, hexamethylphosphoramide, propylene carbonate, ethylene carbonate γ-butyrolactone, dimethylsulfoxide, acetone and sulfolane.

21. The method of claim 15 wherein said aprotic solvent is at least one member selected from the group of nitriles, nitro compounds, amides, cyclic amides, amines, esters, ethers, carbonates, oxides and sulfo compounds.

22. The method of claim 15 wherein the said aprotic solvent is selected from at least one member of the group of acetonitrile, N,N-dimethylformamide, N-methylformamide, N,N-diethylformamide, N-ethylformamide, N,N-dimethylacetamide, N-methyl-2-pyrrolidone, hexamethylphosphoramide propylene carbonate, δ-butyrolactone, dimethylsulfoxide, acetone and sulfolane.

23. The method of claim 14 wherein said reducing agent is selected from the group of benzoin dianion, benzil anion, anthracene anion, dibenzoylmethane radical anion, benzophenone anion, anthraquinone anion, 9-fluorenone anion, N-n-butylphahalimide anion, N,N'-di-n-butyl-3-3',4,4' -biphenylteteracarboxy-lic diimide anion, N,N'-di-n-butylpyromellitimide anion, 1-azafluoranthene anion.

24. The method of claim 1 wherein said electrons are supplied electrochemically.

25. The method of claim 1 wherein said electrons are supplied electrochemically by a cathode in contact with said compound in an electrochemical circuit using an aprotic solvent containing a supporting electrolyte salt.

26. The method of claim 25 wherein the electrochemical reduction of said compound is done by either control of the current supply or control of the applied potential.

27. The method of claim 25 wherein said polyimide material is derived from a dianhydride selected from the group of pyromellitic dianhydride, 3,3,4,4'benzophenonetetracarboxylic dianhydride, 3,3-biphenylenetetracarboxylic dianhydride, naphthalenetetracarboxylic dianhydride, perylenetetracarboxylic dianhydride, 4,4'-(hexafluoroisopropylidene)-bis-phthalic anhydride, and bis (3,4-dicarboxyphenyl) sulfide dianhydride.

28. The method of claim 25 wherein said supporting electrolyte salt contains a cation of at least on member of the group tetraalkylammonium. tetraalkylphosphonium, alkali metal, mixed alkyl-aryl ammonium, mixed alkyl-aryl phosphonium, or chelated metal, and said supporting electrolyte salt anion is selected from at least one member of the group tetrafluoroborate, hexafluorophosphate, perchlorate, halide, aryl sulfonate, or aromatic organic compounds.

29. The method of claim 25 wherein said supporting electrolyte salt is at least one member selected from the group tetrabutylammonium tetrafluoroborate, tetraethylammonium tetrafluoroborate, tetrabutylammonium hexafluorophosphate, tetraethylammonium bromide, lithium tetrafluoroborate, lithium tetrafluoroborate, lithium perchlorate, benzyltributylammonium tetrafluoroborate.

30. The method of claim 1 wherein the surface of a body formed from said compound is patterned with a resist like material or metal or inorganic material to act as a mask prior to supplying electrons to said carbonyl conjugated to an aromatic group thereby selectively exposing said surface to said electrons.

31. The methods of claim 1, wherein the electrophile having S as said Y constituent is selected from the group consisting of aliphatic, aromatic and aromatic-aliphatic disulfides.

32. The method of claim 1, wherein said electrophile chemically combines with the oxygen atom of said carbonyl group conjugated to an aromatic moiety.

33. The method of claim 1, wherein the electrophile having C as the Y constituent is selected from the group consisting of substituted and unsubstituted aliphatic, aromatic and heterocyclic halides and anhydrides.

34. The method of claim 1, wherein the electrophile having P as the Y constituent is selected from the group consisting of halodialkylphosphines, halodiarylphosphines and phosphorous oxychlorides.

35. The method of claim 1 wherein the electrophile having Si as the Y constituent is selected from the group consisting of silylhalides and silazanes.

36. The method of claim 1, wherein a support solvent for said electrophile is an aprotic solvent.

37. The method of claim 1, wherein said electrons supplied to said carbonyl group conjugated to said aromatic moiety provides a reduced form of said compound, one of said electrons substantially residing at the oxygen atom of said carbonyl group wherein said electrophile chemically combines with said oxygen atom having said electron thereon.

38. The method of claim 1, further including converting said derivative back to said compound by treating said derivative with an acid or acidic solution.

39. A method for forming a derivative of a compound containing the following group comprising:

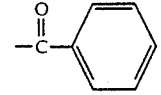

supplying electrons to said group of said compound to form a reduced form of said compound;
contacting said reduced form with an electrophile selected from the group consisting of compounds having structural formula:

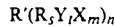

wherein R is selected from the group consisting of a aliphatic radical, a substituted aliphatic radical, an aromatic radical, a substituted aromatic radical, a heterocyclic radical a substituted heterocyclic radical and combinations thereof,
wherein Y is selected from the group consisting of S, C, P and Si,
wherein X is a cationic leaving group,
wherein $s \geq 0$, $t \geq 0$, $m \geq 1$ and $n \geq 1$;
wherein each member of the group of R', R, Y and X forms at least one chemical bond with at least one other member of the group R, R',Y and X; and wherein there is at least one X bound to one Y, said Y of said electrophile chemically combining with the oxygen atom of said at least one carbonyl group.

40. A method for forming a derivative of a compound containing a carbonyl group conjugated to an aromatic moiety, comprising:

supplying electrons to said carbonyl group conjugated to an aromatic moiety of said compound to form a reduced compound in a solution of said reduced compound and a solvent;

adding to said solution an electrophile containing at least one atom selected from the group consisting of S, C, P and Si, there being at least one anionic leaving group bonded to said at least one atom; and said electrophile chemically combining with the oxygen atom of said carbonyl group conjugated to an aromatic moiety.

41. A compound having structural formula:

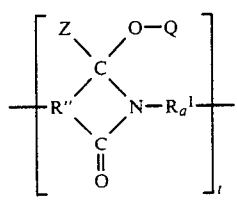

wherein $t \geq 1$;
wherein R" is an organic radical;
wherein $R^1$ is an organic radical;
wherein a is 0 or 1;
wherein Z is selected from the group of free electron radicals and a hydrogen radical; and
wherein Q is selected from the group consisting of organic and inorganic radials.

42. The compound of claim 41 wherein Q includes atoms selected from the group consisteing of S, C, P and Si.

43. The compound of claim 42 wherein Q is an organic radical.

44. The compound of claim 41, wherein R" has structural formula wherein R is a tetravalent organic radical

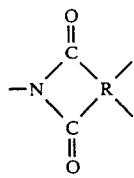

45. The compound of claim 41 wherein Q has general chemical formula:

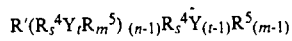

wherein Y is selected from the group consisting of S, C, P and Si;

wherein $R^4$ is at least one from the group of an aliphatic radical, a substituted aliphatic radical, an aromatic radical, a substituted aromatic radical, a heterocyclic radical a substituted heterocyclic radical and combinations thereof; and wherein $R^5$ is selected from one or more of a repeat unit of the same molecule of said compound, a repeat unit of another molecule of said compound, a compound containing a metal atom chelated to said Y constituent and an epoxy molecule.

46. The compound of claim 41, wherein said tetravalent organic radical is at least one selected from the group consisting of:

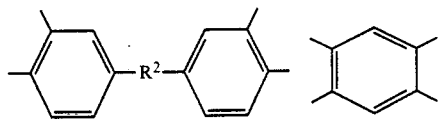
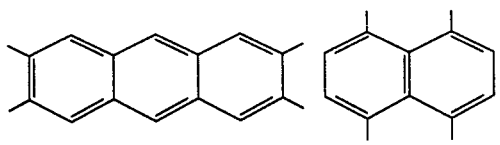
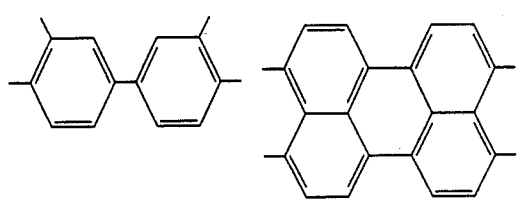
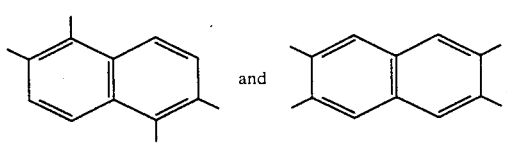

wherein $R^2$ is selected from the group consisting of divalent aliphatic hydrocarbon radicals having from 1 to 4 carbon atoms and carbonyl, oxy, sulfo, sulfide, ether, siloxane, phosphine oxide, hexafluoroisopropylidene and sulfonyl radicals;

wherein $R^1$ is at least one divalent radical selected from the group consisting of an aliphatic organic radical and from the group of

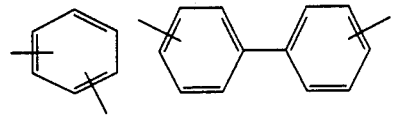
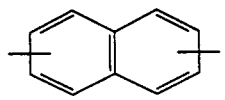
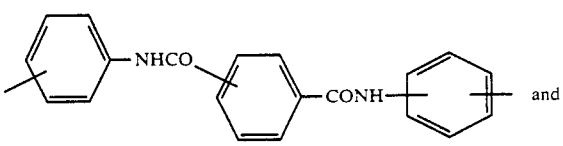
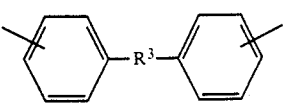

wherein R³ is a divalent organic radical selected from the group consisting of R², silico and amino radical.

47. A compound having structural formula:

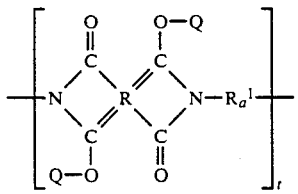

wherein t ≧ 1,
wherein R¹ is an organic radical;
wherein a is 0 or 1;
wherein R is a tetravalent organic radical; and
    wherein Q is selected from the group of organic and inorganic radicals.

48. The compound of claim 47, wherein Q includes atoms selected from the group consisting of S, C, P and Si.

49. The compound of claim 48, wherein Q is an organic radical.

50. The compound of claim 47, wherein Q has general formula:

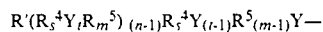

wherein Y is selected from the group consisting of S, C, P and Si;
    wherein R⁴ is at least one from the group of substituted and nonsubstituted aliphatic radicals, aromatic radicals, heterocyclic radicals and combinations thereof; and
    wherein R⁵ is selected from one or more of a repeat unit of the same said compound, a repeat unit of another molecule of said compound, a compound containing a metal atom chelated to said Y constitutent and an epoxy molecule.

51. The compound of claim 47, wherein said tetravalent organic radical is at least one selected from the group consisting of:

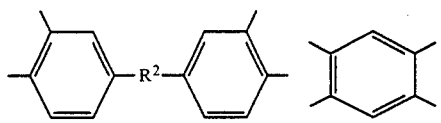

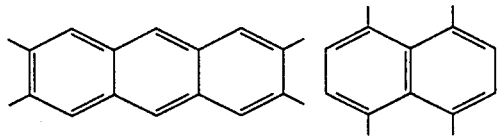

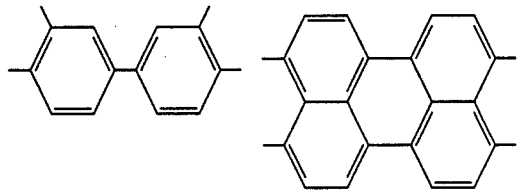

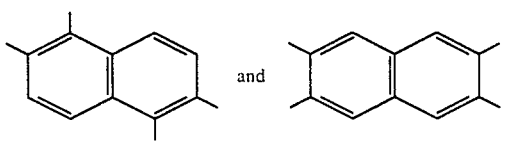

wherein R² is selected from the group consisting of divalent aliphatic hydrocarbon radicals having from 1 to 4 carbon atoms and carbonyl, oxy, sulfo, sulfide, ether, siloxane, phosphine oxide, hexafluoroisopropylidene and sulfonyl radicals;
wherein R¹ is at least one divalent radical selected from the group consisting of an aliphatic organic radical and from the group of

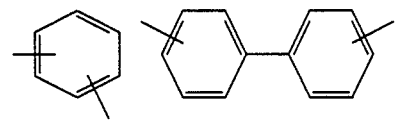

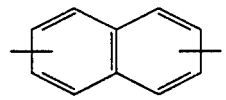

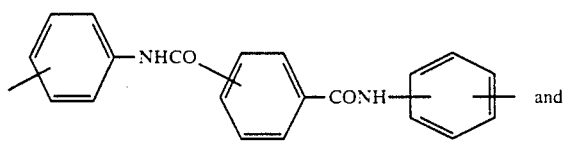

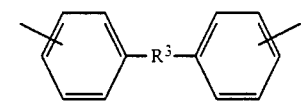

wherein R³ is a divalent organic radical selected from the group consisting of R₂, silico, and amino radicals.

* * * * *